United States Patent
Wi et al.

(10) Patent No.: US 12,542,526 B2
(45) Date of Patent: Feb. 3, 2026

(54) MATCHING NETWORK MODULE COMPRISING PLURAL MATCHING NETWORKS DISPOSED IN PLURAL HOUSINGS THAT ARE COUPLABLE OR DECOUPLABLE FROM EACH OTHER

(71) Applicant: SEMES CO., LTD., Chungcheongnam-do (KR)

(72) Inventors: Sung Suk Wi, Chungcheongnam-do (KR); Yoon Seok Choi, Chungcheongnam-do (KR); Hanlim Kang, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 170 days.

(21) Appl. No.: 18/507,420

(22) Filed: Nov. 13, 2023

(65) Prior Publication Data
US 2024/0177971 A1    May 30, 2024

(30) Foreign Application Priority Data

Nov. 24, 2022  (KR) .......... 10-2022-0159224

(51) Int. Cl.
*H03H 7/38* (2006.01)
*H01J 37/32* (2006.01)

(52) U.S. Cl.
CPC ......... *H03H 7/38* (2013.01); *H01J 37/32165* (2013.01); *H01J 37/32183* (2013.01); *H01J 2237/3341* (2013.01); *H03H 2007/386* (2013.01)

(58) Field of Classification Search
CPC ................... H03H 2007/386; H03H 7/38
USPC ............................................. 333/32
See application file for complete search history.

(56) References Cited

U.S. PATENT DOCUMENTS

| | | |
|---|---|---|
| 6,423,278 B2 | 7/2002 | Choi |
| 9,640,368 B2 | 5/2017 | Umehara |
| 2002/0163398 A1* | 11/2002 | Kondo et al. ..... H01J 37/32183 333/263 |
| 2021/0057188 A1* | 2/2021 | Ni et al. .................. H03H 7/40 |
| 2022/0200561 A1 | 6/2022 | Matsunaga |

FOREIGN PATENT DOCUMENTS

| | | |
|---|---|---|
| KR | 10-0373491 B1 | 2/2003 |
| KR | 10-1996986 B1 | 7/2019 |
| KR | 10-2022-0006069 A | 1/2022 |

* cited by examiner

*Primary Examiner* — Benny T Lee
(74) *Attorney, Agent, or Firm* — Carter, DeLuca & Farrell LLP

(57) ABSTRACT

Provided is a matching network module including a plurality of housings individualized to reduce cross radio frequency (RF) interference, a plurality of matching networks respectively mounted in the plurality of housings to separately perform impedance matching between a plurality of RF generators and a plasma chamber, and a common output rod connecting output terminals of the plurality of matching networks to each other.

16 Claims, 10 Drawing Sheets

MATCHING NETWORK MODULE COMPRISING PLURAL MATCHING NETWORKS DISPOSED IN PLURAL HOUSINGS THAT ARE COUPLABLE OR DECOUPLABLE FROM EACH OTHER

CROSS-REFERENCE TO RELATED PATENT APPLICATION

This application claims the benefit of Korean Patent Application No. 10-2022-0159224, filed on Nov. 24, 2022, in the Korean Intellectual Property Office, the disclosure of which is incorporated herein in its entirety by reference.

BACKGROUND OF THE INVENTION

1. Field of the Invention

The present invention relates to a plasma apparatus and, more particularly, to a matching network module for manufacturing semiconductor devices, and a substrate processing apparatus including the same.

2. Description of the Related Art

Various processes may be performed in a substrate processing apparatus in a vacuum atmosphere to manufacture semiconductor devices. For example, a substrate may be loaded into a plasma chamber of the substrate processing apparatus and an etching process may be performed to etch a thin film thereon. The substrate processing apparatus uses a plasma atmosphere to lower a reaction temperature and activate a process gas.

Currently, due to high integration of the semiconductor devices, higher process precision is required and user requirements are diversified. As such, radio frequency (RF) powers of various frequencies are used to form a plasma atmosphere in the substrate processing apparatus, and a plurality of matching networks are configured in a matching box to correspond to the various frequencies.

However, according to an existing substrate processing apparatus, when RF powers of multiple frequency bands are used at the same time, cross RF interference occurs between matching networks and arcing also occurs frequently. Furthermore, when RF power increases for high precision etching, the above problems become more serious and a matching failure rate increases. In addition, when a matching network of a specific frequency in a matching box needs to be repaired, because the matching box itself needs to be replaced or repaired, equipment operation efficiency is reduced and various customer requirements are not easily satisfied.

SUMMARY OF THE INVENTION

The present invention provides a matching network module capable of flexibly satisfying various customer requirements, of reducing cross radio frequency (RF) interference between matching networks, and of increasing operation efficiency, and a substrate processing apparatus including the matching network module. However, the above description is an example, and the scope of the present invention is not limited thereto.

According to an aspect of the present invention, there is provided a matching network module including a plurality of housings individualized to reduce cross radio frequency (RF) interference, a plurality of matching networks respectively mounted in the plurality of housings to separately perform impedance matching between a plurality of RF generators and a plasma chamber, and a common output rod connecting output terminals of the plurality of matching networks to each other.

The common output rod may include a plurality of fixing rods separately mounted on the plurality of housings so as to be separately connected to the output terminals of the plurality of matching networks, and at least one connecting rod connected to at least some of the fixing rods.

At least some of the plurality of fixing rods and the at least one connecting rod may be fitted to each other.

At least two adjacent ones of the plurality of housings may be couplable to or decouplable from each other.

Coupling grooves may be formed at coupling positions of the at least two adjacent housings to be coupled to each other, and alignment plates may be fitted into the coupling grooves to couple the at least two adjacent housings to each other.

At least some of the plurality of housings may be coupled to each other in a row or stacked on each other.

Each matching network may include at least one variable capacitor and at least one inductor connected to each other, and a capacitance controller connected to the at least one variable capacitor may be mounted in each housing to adjust a capacitance value of the at least one variable capacitor.

An integrated filter including at least one filter for filtering output signals of the plurality of matching networks may be connected to the common output rod.

The plurality of housings may include a first housing, a second housing, and a third housing, and the plurality of matching networks may include a first matching network mounted in the first housing, a second matching network mounted in the second housing, and a third matching network mounted in the third housing.

According to another aspect of the present invention, there is provided a matching network module including a plurality of housings individualized to reduce cross radio frequency (RF) interference, a plurality of matching networks respectively mounted in the plurality of housings to separately perform impedance matching between a plurality of RF generators and a plasma chamber, and a common output rod connecting output terminals of the plurality of matching networks to each other, wherein the common output rod includes a plurality of fixing rods separately mounted on the plurality of housings so as to be separately connected to the output terminals of the plurality of matching networks, and at least one connecting rod connected to at least some of the fixing rods, wherein at least two adjacent ones of the plurality of housings are couplable to or decouplable from each other, wherein coupling grooves are formed at coupling positions of the at least two adjacent housings to be coupled to each other, and wherein alignment plates are fitted into the coupling grooves to couple the at least two adjacent housings to each other.

According to another aspect of the present invention, there is provided a substrate processing apparatus including a plurality of radio frequency (RF) generators, a matching network module connected to the plurality of RF generators, and a plasma chamber connected to the matching network module and having a reaction space, wherein the matching network module includes a plurality of housings individualized to reduce cross RF interference, a plurality of matching networks respectively mounted in the plurality of housings to separately perform impedance matching between the plurality of RF generators and the plasma chamber, and a common output rod connecting output terminals of the plurality of matching networks to each other.

The plurality of RF generators may include a first RF generator for generating first RF power of a first frequency, a second RF generator for generating second RF power of a second frequency, and a third RF generator for generating third RF power of a third frequency, the plurality of housings may include a first housing, a second housing, and a third housing, and the plurality of matching networks may include a first matching network mounted in the first housing and connected to the first RF generator, a second matching network mounted in the second housing and connected to the second RF generator, and a third matching network mounted in the third housing and connected to the third RF generator.

The first frequency may have a low frequency (LF) range of 200 KHz to 500 KHz, the second frequency may have a medium frequency (MF) range of 1 MHz to 10 MHz, and the third frequency may have a high frequency (HF) range of 50 MHz to 100 MHz.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
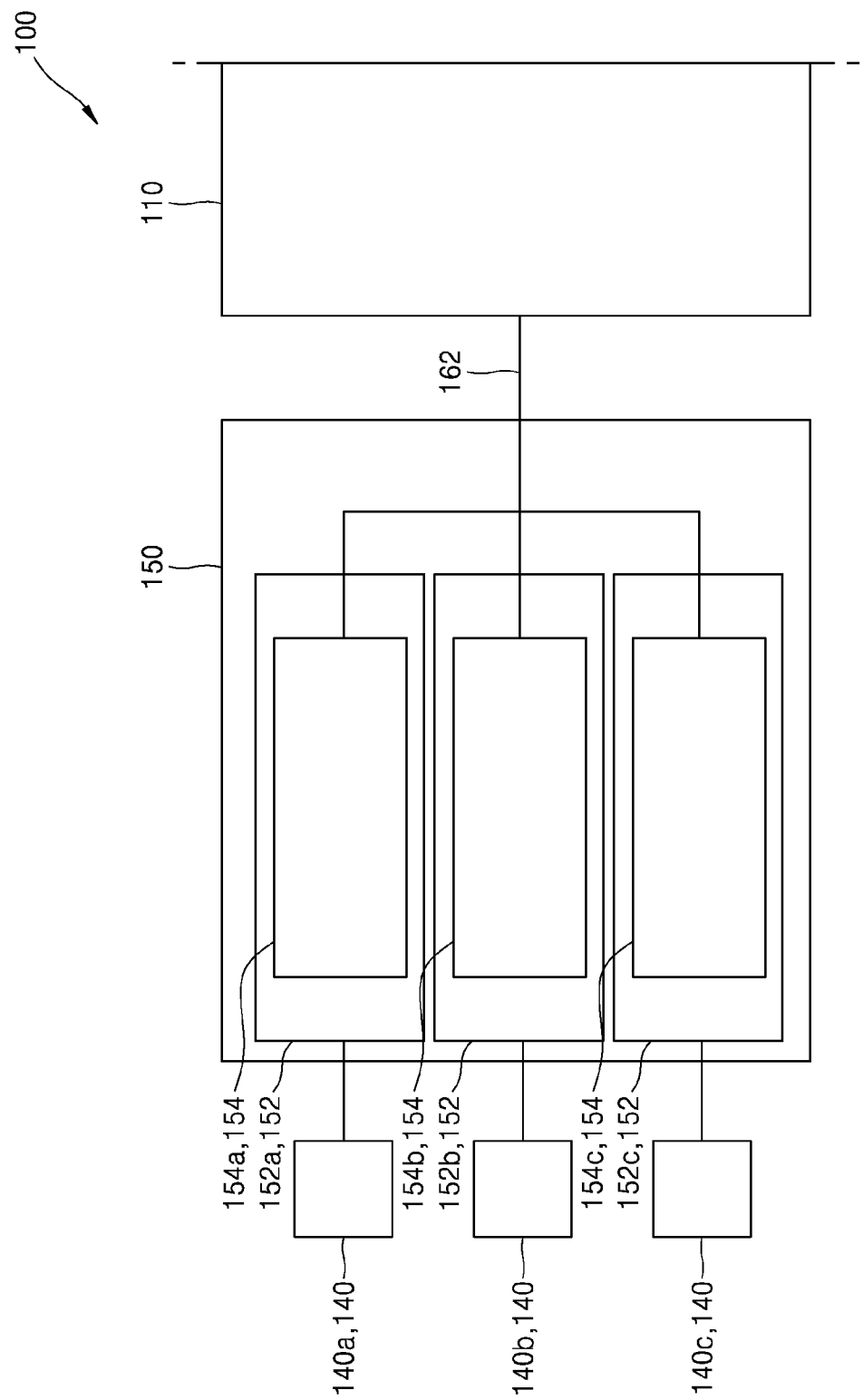
FIG. 1 is a schematic diagram of a matching network module and a substrate processing apparatus according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art.

In the drawings, the thicknesses or sizes of layers are exaggerated for clarity and convenience of explanation. Variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
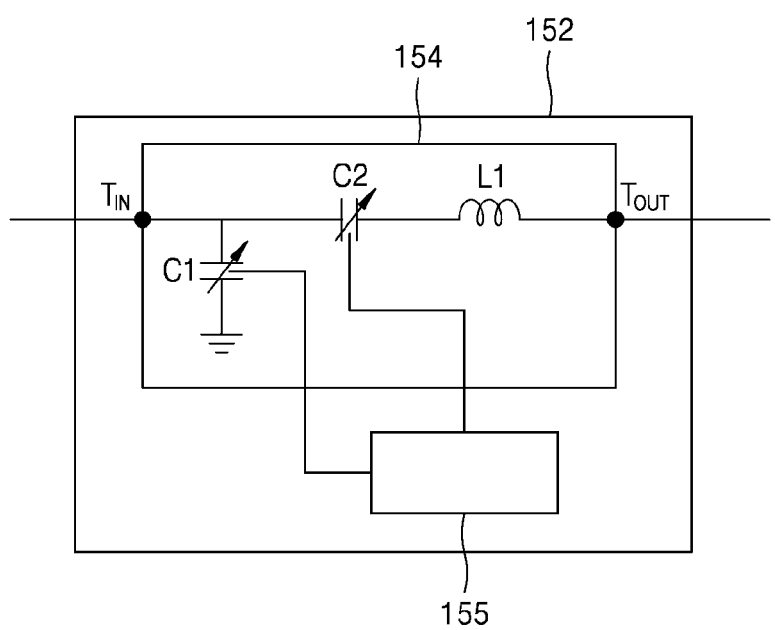
FIG. 2 is a circuit diagram of a matching network of the matching network module of FIG. 1.

FIG. 1 is a schematic diagram of a matching network module 150 and a substrate processing apparatus 100 according to an embodiment of the present invention, and FIG. 2 is a circuit diagram of a matching network of the matching network module 150 of FIG. 1.

Referring to FIGS. 1 and 2, the matching network module 150 may include a plurality of housings 152, a plurality of matching networks 154, and a common output rod 162.

The matching network module 150 may be provided to perform impedance matching between radio frequency (RF) generators 140 and a plasma chamber 110 as shown in FIG. 1. For example, the matching network module 150 may function to adjust an impedance for impedance matching between each RF generator 140 and the plasma chamber 110 to reduce the reflection and return of RF power due to an impedance difference between the two.

Because the impedance of the RF generators 140 is changed when a frequency generated thereby is changed, impedance matching may be changed depending on RF power output from the RF generators 140. A plurality of RF generators 140 may be used based on various frequency bands to meet various user requirements and increase process precision. Therefore, depending on the number of RF generators 140, the number of matching networks 154 in the matching network module 150 may be changed. For example, when the frequency bands of the RF generators 140 are different from each other, the RF generators 140 and the matching networks 154 may be provided in equal numbers and 1:1 correspond to each other.

The matching network module 150 will now be described in detail.

The housings 152 may be respectively or separately provided for the matching networks 154 to reduce cross RF interference. The matching networks 154 may be respectively or separately mounted in the housings 152 and thus cross RF interference between the matching networks 154 may be reduced. In this regard, the housings 152 may be at least partially made of an RF blocking material or at least partially include a conductive layer. For example, the housings 152 may be made of an insulator coated with a conductor or at least partially include a metal sheet.

The matching networks 154 may be respectively or separately mounted in the housings 152 to separately perform impedance matching between the RF generators 140 and the plasma chamber 110. For example, the matching networks 154 may include networks of matching elements, e.g., LC circuits, LCC circuits, LCL circuits, LCCL circuits, RLC circuits, RLCC circuits, RLCL circuits, or RLCCL circuits. The matching networks 154 may vary a capacitance component to adjust an impedance thereof.

In some embodiments, as shown in FIG. 2, each matching network 154 may include at least one variable capacitor C1 or C2 and at least one inductor L1. The number of variable capacitors C1 and C2 may be one or more. For example, although two variable capacitors C1 and C2 are illustrated in FIG. 2, only one of the two may have a variable capacitance and the other may have a fixed capacitance.

Furthermore, a capacitance controller 155 may be mounted in each housing 152 to adjust a capacitance value of the variable capacitor C1 or C2. For example, the variable capacitor C1 or C2 may include an electrode piece which rotates mechanically, and the capacitance controller 155 may be connected to the variable capacitor C1 or C2 to rotate the electrode piece.

In some embodiments, the variable capacitor C1 or C2 may include a capacitor array having a capacitance electronically variable depending on a combination of capacitors. The capacitance of the capacitor array may be controlled by a switching element for adjusting the combination of the capacitors.

Each matching network 154 may include an input terminal $T_{IN}$ and an output terminal $T_{OUT}$. The RF generators 140 may be separately connected to the input terminals $T_{IN}$ of the matching networks 154, and the plasma chamber 110 may be connected to the output terminals $T_{OUT}$ of the matching networks 154.

The common output rod 162 (FIG. 1) may connect the output terminals Tour of the matching networks 154 to each other and be connected to the plasma chamber 110. For example, the common output rod 162 may include metal rods having high thermal conductivity to reduce power loss.

In some embodiments, as shown in FIG. 1, the housings 152 in the matching network module 150 may include a first housing 152a, a second housing 152b, and a third housing 152c. The matching networks 154 may include a first matching network 154a mounted in the first housing 152a, a second matching network 154b mounted in the second housing 152b, and a third matching network 154c mounted in the third 5 housing 152c.

The first, second, and third housings 152a, 152b, and 152c may be individualized from each other and be decoupled from or coupled to each other. The first, second, and third matching networks 154a, 154b, and 154c may be connected to different RF generators 140. For example, the first matching network 154a may be connected to a first RF generator 140a, the second matching network 154b may be connected to a second RF generator 140b, and the third matching network 154c may be connected to a third RF generator 140c.

The substrate processing apparatus 100 may be configured using the above-described matching network module 150. For example, the substrate processing apparatus 100 may include the RF generators 140, the matching network module 150, and the plasma chamber 110.

The RF generators 140 may generate RF powers of various frequencies. For example, each RF generator 140 may include a rectifier for rectifying alternating current (AC) power, a direct current (DC) power controller, an RF converter, and a phase controller.

In some embodiments, as shown in FIG. 1, the RF generators 140 may include a first RF generator 140a for generating first RF power of a first frequency, a second RF generator 140b for generating second RF power of a second frequency, and a third RF generator 140c for generating third RF power of a third frequency. For example, the first frequency may have a low frequency (LF) range of 200 KHz to 500 KHz, the second frequency may have a medium frequency (MF) range of 1 MHz to 10 MHz, and the third frequency may have a high frequency (HF) range of 50 MHz to 100 MHz. In this case, the first RF generator 140a may generate LF power, the second RF generator 140b may generate MF power, and the third RF generator 140c may generate HF power.

In the matching network module 150, the first matching network 154a may be mounted in the first housing 152a and connected to the first RF generator 140a, the second matching network 154b may be mounted in the second housing 152b and connected to the second RF generator 140b, and the third matching network 154c may be mounted in the third housing 152c and connected to the third RF generator 140c.

When plasma is formed in the plasma chamber 110, RF power may be generated by at least one of the RF generators 140 and transmitted through the matching network module 150 to the plasma chamber 110. For example, RF powers may be generated by at least two of the RF generators 140, adjusted in impedance by the matching network module 150, and then transmitted through the common output rod 162 to the plasma chamber 110. A plasma atmosphere may be formed in the plasma chamber 110 by the RF powers.

In some embodiments, when an insulator (e.g., oxide or nitride) etching process is performed in the plasma chamber 110, the first RF generator 140a may generate LF power and transmit the LF power through the first matching network 154a to the plasma chamber 110, and the third RF generator 140c may generate HF power and transmit the HF power through the third matching network 154c to the plasma chamber 110. In this case, a plasma atmosphere may be formed in the plasma chamber 110 by using the LF power and the HF power. Optionally, when the insulator etching process is performed in the plasma chamber 110, the second RF generator 140b may generate MF power and transmit the MF power through the second matching network 154b to the plasma chamber 110 in addition to the LF power and the HF power.

In some embodiments, when a conductor etching process is performed in the plasma chamber 110, the first RF generator 140a may generate LF power and transmit the LF power through the first matching network 154a to the plasma chamber 110, and the second RF generator 140b may generate MF power and transmit the MF power through the second matching network 154b to the plasma chamber 110. In this case, a plasma atmosphere may be formed in the plasma chamber 110 by using the LF power and the MF power.

In some embodiments, the number of RF power generators 140 may be changed to two, four, or more. In this case, the numbers of housings 152 and matching networks 154 in the matching network module 150 may also be changed to two, four, or more depending on the number of RF power generators 140.

According to the above-described matching network module 150 and the substrate processing apparatus 100 using the same, when RF powers of various frequencies are required, the number of RF power generators 140 may be changed based on the user requirement and the numbers of housings 152 and matching networks 154 in the matching network module 150 may also be changed accordingly. Furthermore, because the matching networks 154 are separately mounted in the housings 152, cross RF interference between the matching networks 154 may be reduced and a matching failure rate due to arcing may also be reduced.

When one of the matching networks 154 is broken, a corresponding housing 152 may be decoupled and the matching network 154 may be repaired. Optionally, power transmission may be performed using the other normal matching networks 154. As such, the maintenance and operation efficiency of the matching network module 150 may be increased and the operation efficiency of the entirety of the substrate processing apparatus 100 may also be increased.

Figure 3:
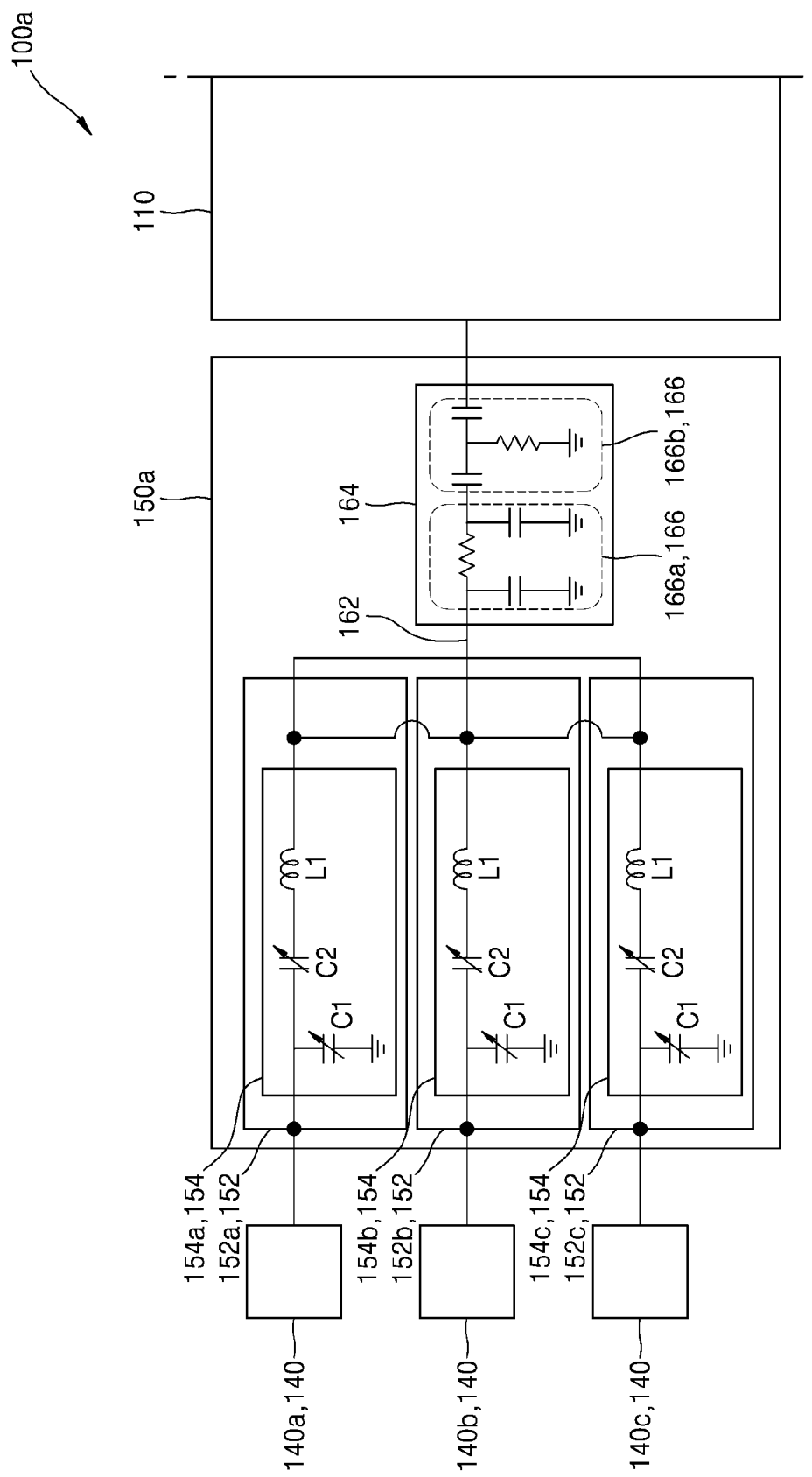
FIG. 3 is a schematic diagram of a matching network module and a substrate processing apparatus according to another embodiment of the present invention.

FIG. 3 is a schematic diagram of a matching network module 150a and a substrate processing apparatus 100a according to another embodiment of the present invention. The matching network module 150a and the substrate processing apparatus 100a may be obtained by adding some elements to the matching network module 150 and the substrate processing apparatus 100 of FIGS. 1 and 2, and a repeated description between the embodiments is not provided herein.

Referring to FIG. 3, in the matching network module 150a, an integrated filter 164 may be connected to the common output rod 162. The integrated filter 164 may include at least one filter 166 to remove noise from the RF powers transmitted through the common output rod 162 or to transmit only power of a specific frequency.

For example, the filter 166 may include a low pass filter (LPF), a high pass filter (HPF), and a band pass filter (BPF). A LPF 166a and a HPF 166b are illustrated as the filter 166 in FIG. 3.

In some embodiments, the integrated filter 164 may be understood not as an element of the matching network module 150a but as an element of the substrate processing apparatus 100a provided between the matching network module 150a and the plasma chamber 110.

According to the matching network module 150a and the substrate processing apparatus 100a, integrated frequency control may be performed by additionally using the integrated filter 164.

Modularization of the matching network module 150 will now be described.

Figure 4:
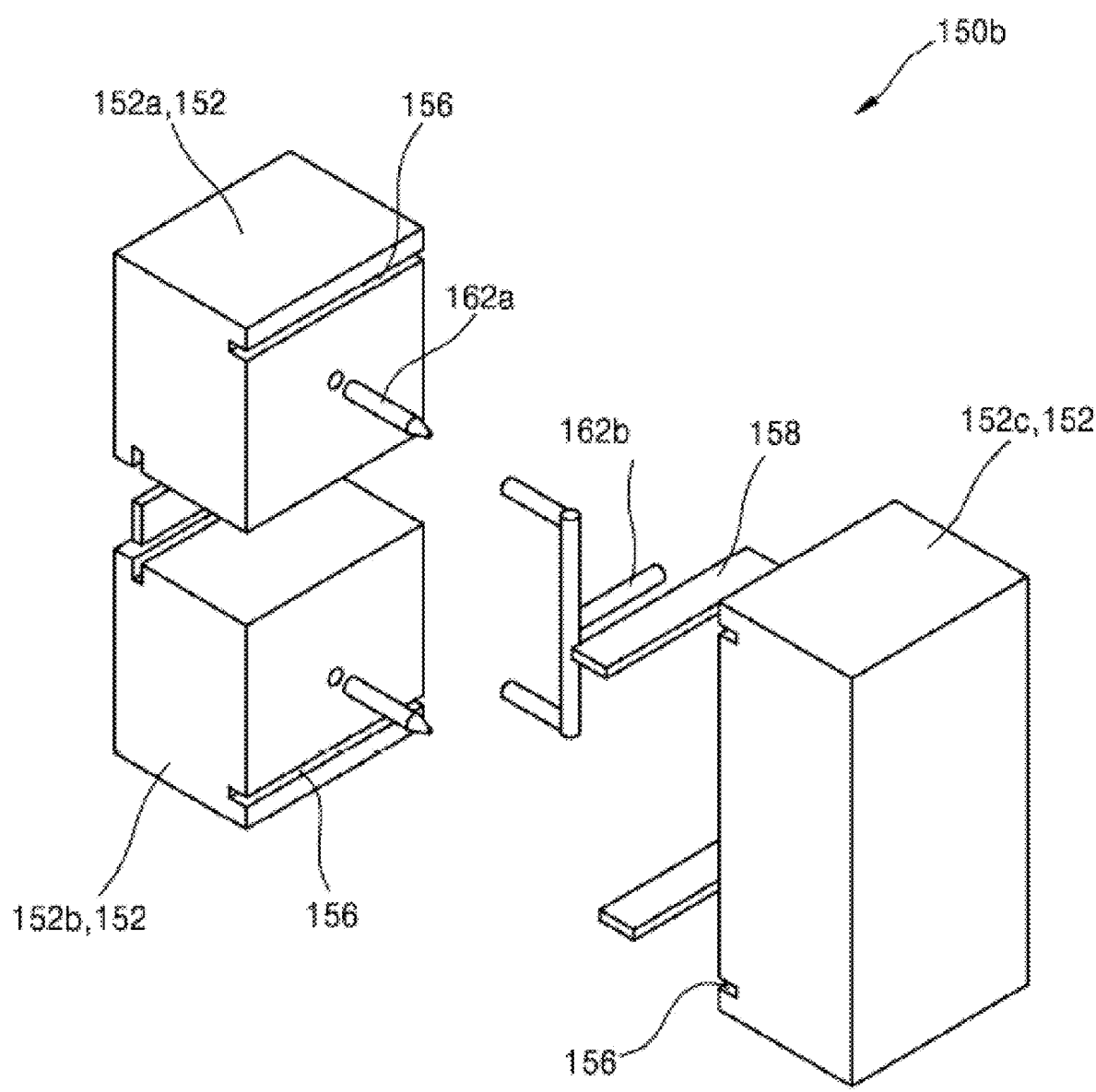
FIGS. 4 to 6 are perspective diagrams showing a coupling structure of a matching network module according to some embodiments of the present invention.
Figure 5:
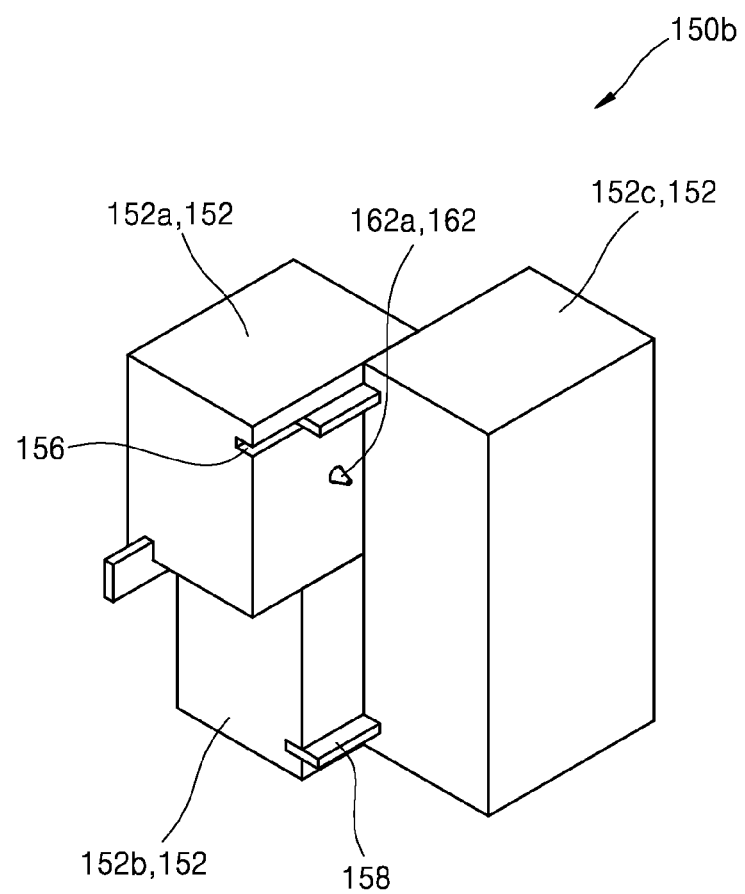
Figure 6:
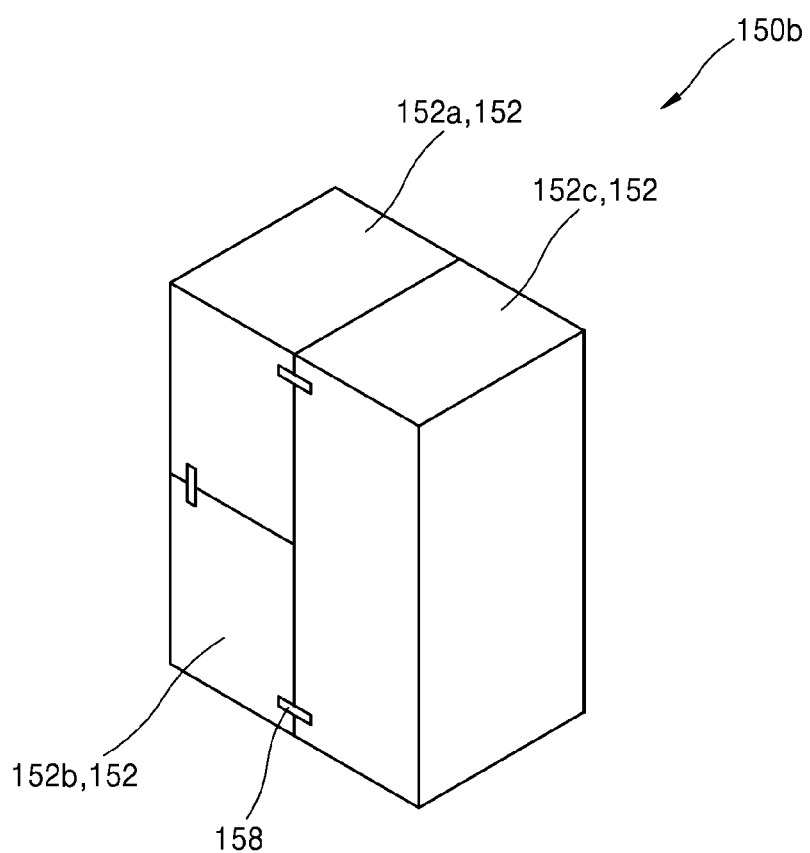

FIGS. 4 to 6 are perspective diagrams showing a coupling structure of a matching network module 150b according to some embodiments of the present invention. The configuration of the matching networks 154 in the matching network module 150b is described above in relation to FIGS. 1 to 3.

Referring to FIGS. 4 to 6, in the matching network module 150b, at least two adjacent ones of the housings 152 may be coupled to or decoupled from each other. For example, coupling grooves 156 (FIGS. 4 and 5) may be formed at coupling positions of the two adjacent housings 152 to be coupled to each other. Furthermore, alignment plates 158 may be fitted into the coupling grooves 156 to couple the two housings 152 to each other.

In some embodiments, at least some of the housings 152 may be coupled to each other in a row or stacked on each other.

Specifically, the first and second housings 152a and 152b may be coupled to or decoupled from each other, the first and third housings 152a and 152c may be coupled to or decoupled from each other, and the second and third housings 152b and 152c may be coupled to or decoupled from each other. The coupling grooves 156 may be formed at coupling positions of the first, second, and third housings 152a, 152b, and 152c, and the alignment plates 158 may be fitted into the coupling grooves 156 to couple the first, second, and third housings 152a, 152b, and 152c to each other. As such, the first, second, and third housings 152a, 152b, and 152c may be coupled to or decoupled from each other by inserting or removing the alignment plates 158.

The first and second housings 152a and 152b may be stacked on each other, and the stacked first and second housings 152a and 152b may be coupled to the third housing 152c in a row or side by side.

By the above-described coupling, the first, second, and third housings 152a, 152b, and 152c may be coupled into one. For example, the first, second, and third housings 152a, 152b, and 152c may be modularized based on the shape of a coupled structure in consideration of coupling. In this regard, the matching network module 150b may also be called a modularized matching network.

In some embodiments, the first, second, and third housings 152a, 152b, and 152c may be coupled to each other by using other coupling means instead of the coupling grooves 156 and the alignment plates 158. For example, the first, second, and third housings 152a, 152b, and 152c may be fastened to each other by using fastening means, e.g., bolts (not shown), or coupled to each other by using physical fitting between male and female couplers.

In some embodiments, when the housings 152 are coupled to each other, the common output rod may be additionally coupled to the coupled structure of the housings 152. For example, the common output rod may include a plurality of fixing rods 162a separately mounted on the housings 152 so as to be separately connected to the output terminals $T_{OUT}$ (FIG. 2) of the matching networks 154. Furthermore, the common output rod may further include at least one connecting rod 162b connected to at least some of the fixing rods 162a.

Meanwhile, when the housings 152 are coupled to each other, at least some of the fixing rods 162a and the connecting rod 162b may be fitted to each other. For example, as shown in FIGS. 5 and 6, the fixing rods 162a may be fitted to each other in a male-female manner between the first, second, and third housings 152a, 152b, and 152c.

For example, the fixing rods 162a of the first and second housings 152a and 152b may have a bar shape, and the fixing rods 162a of the third housing 152c may have a tube shape. Furthermore, the connecting rod 162b may be connected to the fixing rods 162a. The fixing rods 162a are illustrated outside the first, second, and third housings 152a, 152b, and 152c in FIG. 4 but may be fixed inside the first, second, and third housings 152a, 152b, and 152c as shown in FIG. 5. Furthermore, optionally, at least a portion of the connecting rod 162b may be connected to the fixing rod 162a inside the third housing 152c.

Figure 7:
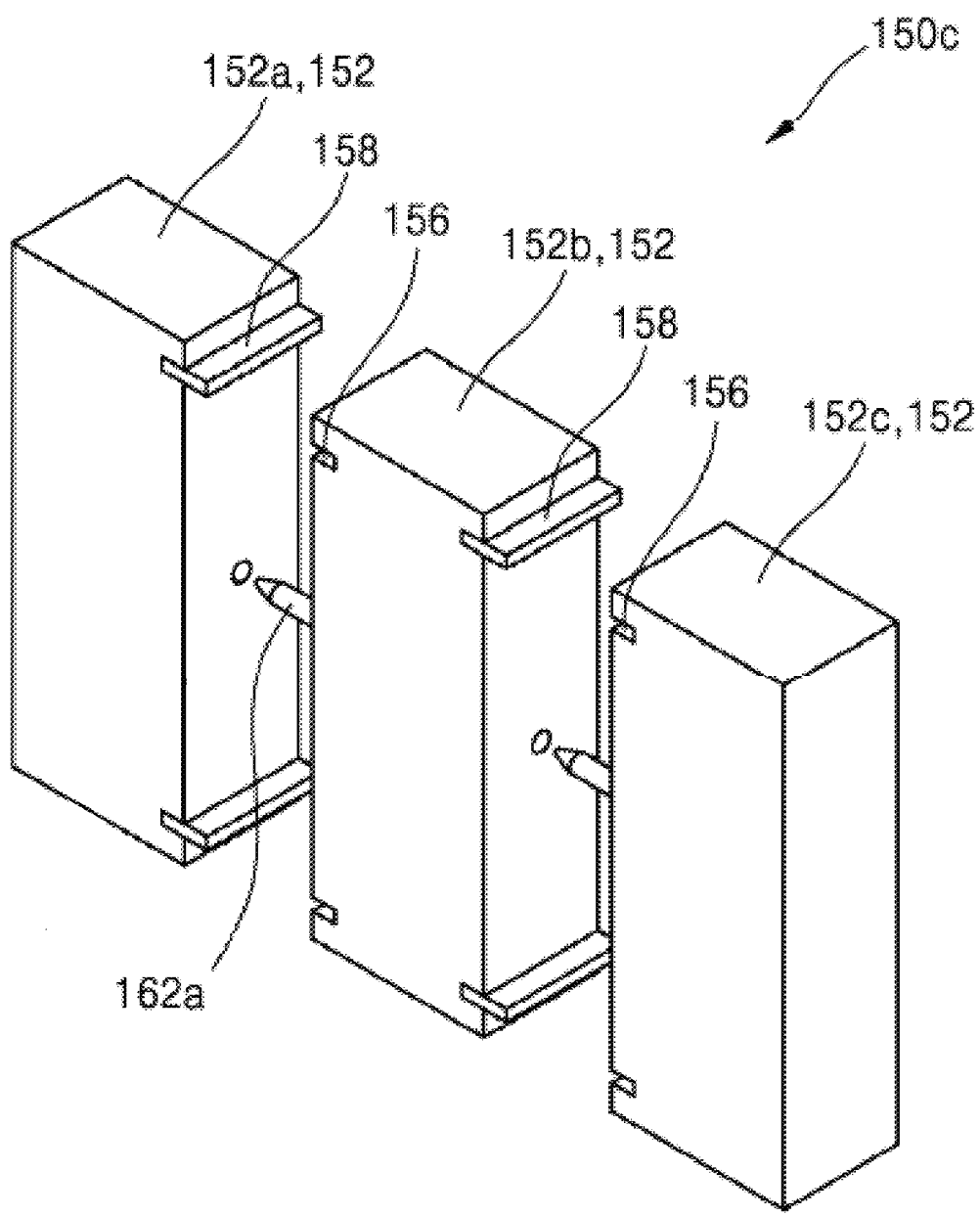
FIGS. 7 and 8 are perspective diagrams showing a coupling structure of a matching network module according to some embodiments of the present invention.
Figure 8:
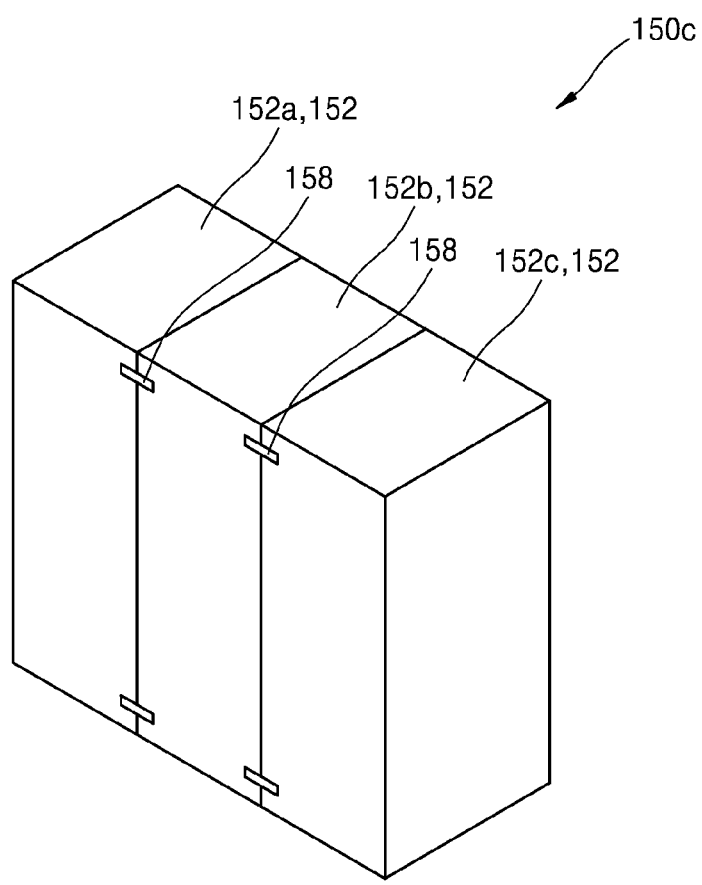

FIGS. 7 and 8 are perspective diagrams showing a coupling structure of a matching network module 150c according to some embodiments of the present invention. The configuration of the matching networks 154 in the matching network module 150c is described above in relation to FIGS. 1 to 3. Furthermore, the matching network module 150c is partially modified from the above-described matching network module 150b, and a repeated description between the embodiments is not provided herein.

Referring to FIGS. 7 and 8, in the matching network module 150c, at least two adjacent ones of the housings 152 may be coupled to or decoupled from each other in a row. For example, the coupling grooves 156 may be formed at coupling positions of the two adjacent housings 152 to be coupled to each other. Furthermore, the alignment plates 158 may be fitted into the coupling grooves 156 to couple the two housings 152 to each other.

Specifically, the first and second housings 152a and 152b may be coupled to or decoupled from each other, and the second and third housings 152b and 152c may be coupled to or decoupled from each other. The coupling grooves 156 may be formed at coupling positions of the first, second, and third housings 152a, 152b, and 152c, and the alignment plates 158 may be fitted into the coupling grooves 156 to couple the first, second, and third housings 152a, 152b, and 152c to each other in a row. As described above, the first, second, and third housings 152a, 152b, and 152c may be coupled into one by using the alignment plates 158.

Meanwhile, when the housings 152 are coupled to each other, the fixing rods 162a may be fitted to each other in a male-female manner between the first, second, and third housings 152a, 152b, and 152c. For example, bar-shaped fixing rods 162a may be coupled to sides of the second and third housings 152b and 152c, and tube-shaped fixing rods 162a may be coupled to other sides of the first and second housings 152a and 152b. As such, the first and second housings 152a and 152b may be fitted to each other, and the second and third housings 152b and 152c may be fitted to each other. The fixing rods 162a at the side and the other side of the second housing 152b may be internally connected to each other.

Furthermore, although not shown in FIGS. 7 and 8, the connecting rod 162b may be connected to the fixing rods 162a.

According to the above-described coupling structures of the matching network modules 150b and 150c, volumes thereof may be reduced by modularizing the housings 152 and coupling the housings 152 to each other. Furthermore, each matching network 154 may be decoupled and repaired or replaced and thus the operation efficiency of the matching network modules 150b and 150c and the substrate processing apparatus 100 may be increased.

A detailed structure of the substrate processing apparatus 100 will now be described.

Figure 9:
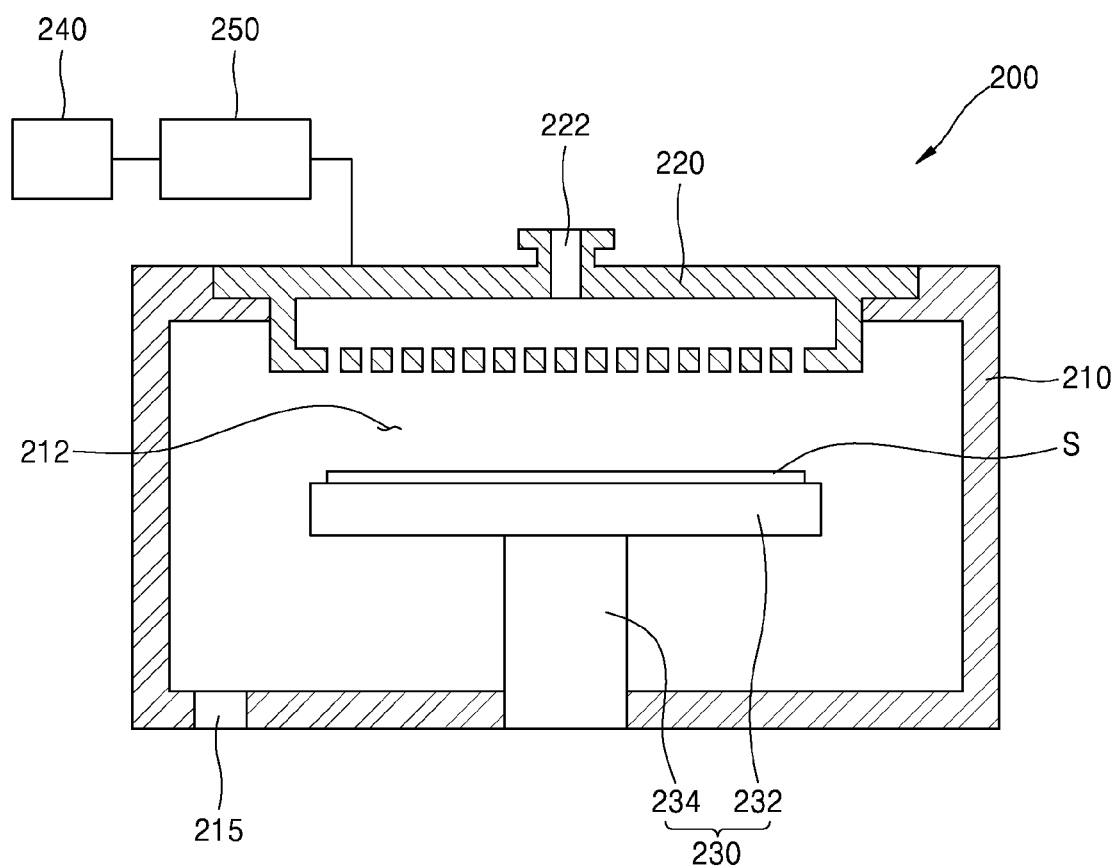
FIG. 9 is a cross-sectional diagram of a substrate processing apparatus according to some embodiments of the present invention.

FIG. 9 is a cross-sectional diagram of a substrate processing apparatus 200 according to some embodiments of the present invention.

Referring to FIG. 9, the substrate processing apparatus 200 may include an RF generator 240, a matching network module 250, a plasma chamber 210, a gas injector 220, and a substrate supporter 230.

Specifically, a reaction space 212 may be formed in the plasma chamber 210. For example, the reaction space 212 may be formed in the plasma chamber 210, and a substrate S may be processed in the reaction space 212. An exhaust port 215 may be formed in the plasma chamber 210, an exhaust line may be connected to the exhaust port 215, and a vacuum pump (not shown) may be connected to the exhaust line to control the inside of the plasma chamber 210 to a vacuum environment. In some embodiments, the plasma chamber 210 may also be called a "process chamber" in that a process is performed therein.

Furthermore, an entrance for loading or unloading the substrate S into or from the reaction space 212 and a gate structure (not shown) for opening or closing the entrance may be mounted on the plasma chamber 210. The process chamber 210 may be provided in various shapes. For example, the process chamber 210 may include a side wall defining the reaction space 212 and a top lead positioned on top of the side wall.

The gas injector 220 may be further coupled to the plasma chamber 210 to inject a process gas onto the substrate S. For example, the gas injector 220 may be coupled on top of the plasma chamber 210 to receive the process gas supplied from the outside through a gas inlet 222 and then inject the process gas into the reaction space 212. The gas injector 220 may have various shapes and be also called a "gas injection unit", a "shower head", a "nozzle", an "injector", or the like.

The substrate supporter 230 may be coupled to the plasma chamber 210 to support the substrate S in the reaction space 212. For example, the substrate supporter 230 may be mounted in the process chamber 210 to face the gas injector 220. The substrate supporter 230 may include a top plate 232 on which the substrate S is seated, and a shaft 234 for supporting the top plate 232. In some embodiments, the substrate supporter 230 may also be called a "substrate holder", a "susceptor", or the like.

Optionally, the substrate supporter 230 may further include, inside the top plate 232, a heater (not shown) for heating the substrate S. Furthermore, the substrate supporter 230 may further include an electrostatic electrode (not shown) capable of applying electrostatic force to fix the substrate S.

The RF generator 240 and the matching network module 250 may correspond to the RF generator 140 and the matching network module 150, 150a, 150b, or 150c described above in relation to FIGS. 1 to 8. The RF generator 240 may include the first, second, and third RF generators 140a, 140b, and 140c as shown in FIGS. 1 to 3.

The substrate processing apparatus 200 is an apparatus for processing the substrate S and may be used as, for example, a substrate etching apparatus for etching at least a portion of the substrate S.

Figure 10:
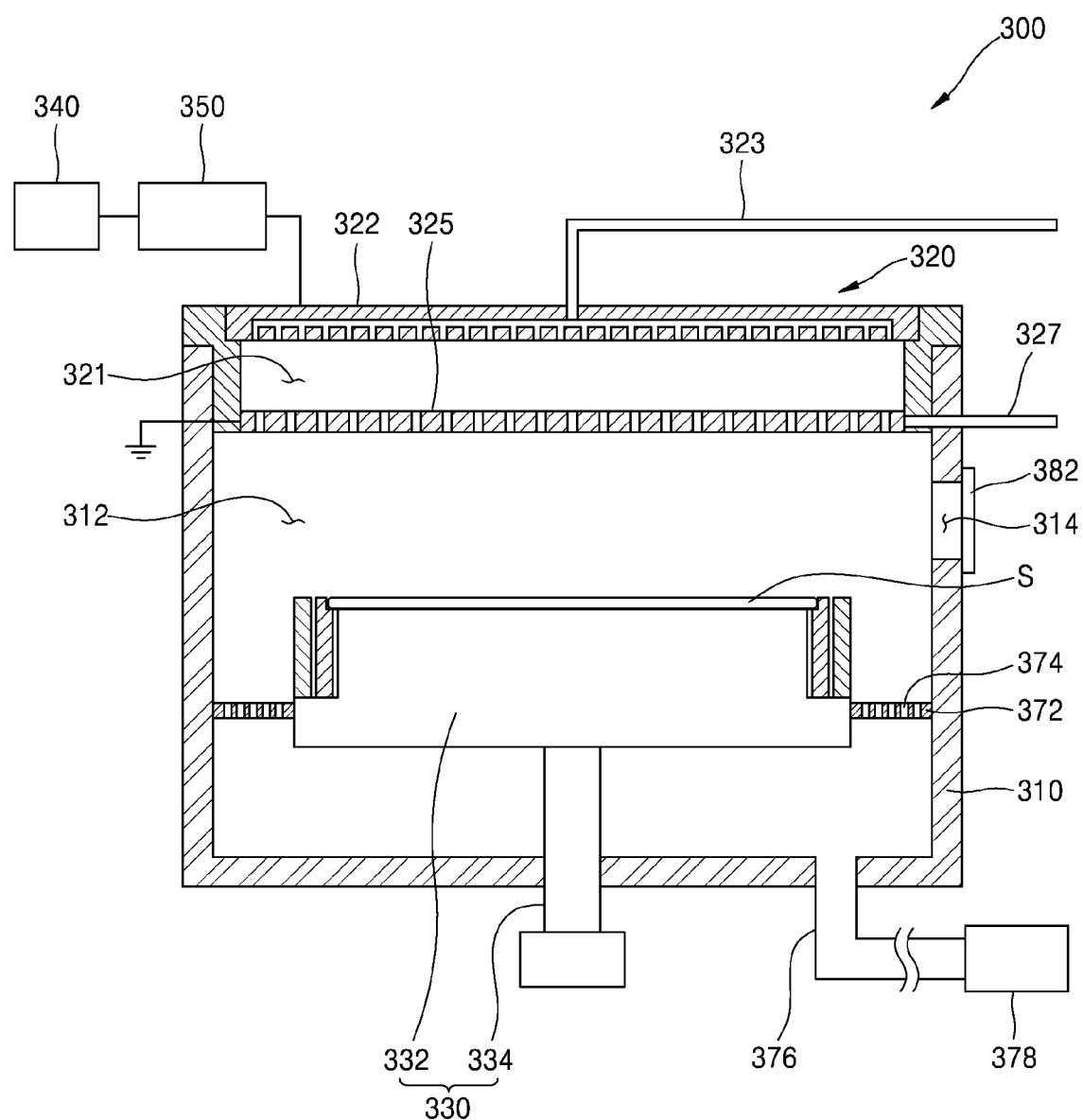
FIG. 10 is a cross-sectional diagram of a substrate processing apparatus according to some embodiments of the present invention.

FIG. 10 is a cross-sectional diagram of a substrate processing apparatus 300 according to some embodiments of the present invention.

Referring to FIG. 10, the substrate processing apparatus 300 may include an RF generator 340, a matching network module 350, a process chamber 310, a plasma chamber 320, and a substrate supporter 330.

Specifically, the process chamber 310 and the plasma chamber 320 are separate in the substrate processing apparatus 300 unlike the substrate processing apparatus 200. A processing space 312 may be formed in and the substrate supporter 330 on which the substrate S is seated may be coupled to the process chamber 310. A substrate inlet 314 may be formed in a side wall of the process chamber 310, and a gate 382 may be coupled thereto to open or close the substrate inlet 314.

An exhaust baffle 372 may be provided in the process chamber 310 to uniformly exhaust residual gases and by-products in different regions from the processing space 312 of the process chamber 310. The exhaust baffle 372 is positioned between an inner wall of the process chamber 310 and the substrate supporter 330 in the processing space 312. For example, the exhaust baffle 372 may be provided in a circular ring shape, and a plurality of through holes 374 may be formed in the exhaust baffle 372. An exhaust pump 378 may be connected through an exhaust line 376 to a downstream side of the exhaust baffle 372 of the process chamber 310 to exhaust the by-products of processing.

The substrate supporter 330 may be coupled to the process chamber 310 to support the substrate S in the processing space 312. The substrate supporter 330 may include a top plate 332 on which the substrate S is seated, and a shaft 334 for supporting the top plate 332. In some embodiments, the substrate supporter 330 may also be called a substrate holder, a susceptor, or the like.

A reaction space 321 may be formed in and gas inlet pipes 323 and 327 may be connected to the plasma chamber 320. The plasma chamber 320 may be disposed on top of the process chamber 310. In the plasma chamber 320, the reaction space 321 may be defined between an upper electrode 322 and an ion blocker 325 which face each other. The upper electrode 322 may be coupled to a top lead of the process chamber 310. The ion blocker 325 may be understood as a kind of shower head. The gas inlet pipe 323 may introduce a process gas into the reaction space 321, and the gas inlet pipe 327 may introduce a process gas through the ion blocker 325 into the processing space 312.

The RF generator 340 may be connected through the matching network module 350 to the upper electrode 322 of the plasma chamber 320. The ion blocker 325 may be grounded. The RF generator 340 and the matching network module 350 may correspond to the RF generator 140 and the matching network module 150, 150a, 150b, or 150c described above in relation to FIGS. 1 to 8. The RF generator 340 may include the first, second, and third RF generators 140a, 140b, and 140c as shown in FIGS. 1 to 3.

According to the substrate processing apparatus 300, the process gas may be supplied through the gas inlet pipe 323 into the reaction space 321, and RF power may be transmitted from the RF generator 340 to the upper electrode 322 to form a plasma atmosphere in the reaction space 321 and activate the process gas. The process gas activated in the reaction space 321 may be supplied through the ion blocker 325 onto the substrate S in the processing space 312. Meanwhile, the process gas supplied through the gas inlet pipe 327 may be supplied onto the substrate S in the processing space 312 in an inactivated state.

The substrate processing apparatus 300 is an apparatus for processing the substrate S and may be used as, for example, a substrate etching apparatus for etching at least a portion of the substrate S.

According to the above-described substrate processing apparatus 200 or 300, RF powers of a plurality of frequencies may be supplied by using the RF generator 240 or 340 and provided to the plasma chamber 210 or 320 without cross RF interference by using the plurality of matching networks 154 (see FIG. 1) in the matching network module 250 or 350. As such, a plasma atmosphere may be stably formed in the plasma chamber 210 or 320 by greatly reducing arcing or the like, and the process reliability for processing the substrate S may be increased.

Based on the matching network module and the substrate processing apparatus according to the afore-described embodiments of the present invention, various customer requirements may be flexibly satisfied by separately mounting matching networks in different housings, cross RF interference between the matching networks may be reduced, and operation efficiency may be increased because each matching network may be independently decoupled and repaired. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A matching network module comprising:
a plurality of housings individualized to reduce cross radio frequency (RF) interference;
a plurality of matching networks respectively mounted in the plurality of housings to separately perform impedance matching between a plurality of RF generators and a plasma chamber; and
a common output rod connecting output terminals of the plurality of matching networks to each other,
wherein at least two adjacent ones of the plurality of housings are couplable to or decouplable from each other.

2. The matching network module of claim 1, wherein the common output rod comprises:
a plurality of fixing rods separately mounted on the plurality of housings so as to be separately connected to the output terminals of the plurality of matching networks; and
at least one connecting rod connected to at least some of the fixing rods.

3. The matching network module of claim 2, wherein at least some of the plurality of fixing rods and the at least one connecting rod are fitted to each other.

4. The matching network module of claim 1, wherein the plurality of housings comprise a first housing, a second housing, and a third housing, and
wherein the plurality of matching networks comprise a first matching network mounted in the first housing, a second matching network mounted in the second housing, and a third matching network mounted in the third housing.

5. The matching network module of claim 1, wherein coupling grooves are formed at coupling positions of the at least two adjacent housings to be coupled to each other, and
wherein alignment plates are fitted into the coupling grooves to couple the at least two adjacent housings to each other.

6. The matching network module of claim 1, wherein at least some of the plurality of housings are coupled to each other in a row or stacked on each other.

7. The matching network module of claim 1, wherein each matching network comprises at least one variable capacitor and at least one inductor connected to each other, and
wherein a capacitance controller connected to the at least one variable capacitor is mounted in each housing to adjust a capacitance value of the at least one variable capacitor.

8. The matching network module of claim 1, wherein an integrated filter comprising at least one filter for filtering output signals of the plurality of matching networks is connected to the common output rod.

9. A substrate processing apparatus comprising:
a plurality of radio frequency (RF) generators;
a matching network module connected to the plurality of RF generators; and
a plasma chamber connected to the matching network module and having a reaction space,
wherein the matching network module comprises:
a plurality of housings individualized to reduce cross RF interference;
a plurality of matching networks respectively mounted in the plurality of housings to separately perform impedance matching between the plurality of RF generators and the plasma chamber; and
a common output rod connecting output terminals of the plurality of matching networks to each other,
wherein the plurality of RF generators comprise a first RF generator for generating first RF power of a first frequency, a second RF generator for generating second RF power of a second frequency, and a third RF generator for generating third RF power of a third frequency,
wherein the plurality of housings comprise a first housing, a second housing, and a third housing,
wherein the plurality of matching networks comprise a first matching network mounted in the first housing and connected to the first RF generator, a second matching network mounted in the second housing and connected to the second RF generator, and a third matching network mounted in the third housing and connected to the third RF generator;
wherein the first frequency has a low frequency (LF) range of 200 KHz to 500 KHz,
wherein the second frequency has a medium frequency (MF) range of 1 MHz to 10 MHz, and
wherein the third frequency has a high frequency (HF) range of 50 MHz to 100 MHz.

10. The substrate processing apparatus of claim 9, wherein an integrated filter comprising at least one filter for filtering output signals of the plurality of matching networks is connected to the common output rod.

11. The substrate processing apparatus of claim 9, wherein the common output rod comprises:
   a plurality of fixing rods separately mounted on the plurality of housings so as to be separately connected to the output terminals of the plurality of matching networks; and
   at least one connecting rod connected to at least some of the fixing rods.

12. The substrate processing apparatus of claim 11, wherein at least some of the plurality of fixing rods and the at least one connecting rod are fitted to each other.

13. The substrate processing apparatus of claim 9, wherein at least two adjacent ones of the plurality of housings are couplable to or decouplable from each other,
   wherein coupling grooves are formed at coupling positions of the at least two adjacent housings to be coupled to each other, and
   wherein alignment plates are fitted into the coupling grooves between the at least two adjacent housings to couple the at least two adjacent housings to each other.

14. A matching network module comprising:
   a plurality of housings individualized to reduce cross radio frequency (RF) interference;
   a plurality of matching networks respectively mounted in the plurality of housings to separately perform impedance matching between a plurality of RF generators and a plasma chamber; and
   a common output rod connecting output terminals of the plurality of matching networks to each other,
   wherein the common output rod comprises:
   a plurality of fixing rods separately mounted on the plurality of housings so as to be separately connected to the output terminals of the plurality of matching networks; and
   at least one connecting rod connected to at least some of the fixing rods,
   wherein at least two adjacent ones of the plurality of housings are couplable to or decouplable from each other,
   wherein coupling grooves are formed at coupling positions of the at least two adjacent housings to be coupled to each other, and
   wherein alignment plates are fitted into the coupling grooves to couple the at least two adjacent housings to each other.

15. The matching network module of claim 14, wherein at least some of the plurality of fixing rods and the at least one connecting rod are fitted to each other.

16. The matching network module of claim 15, wherein the plurality of housings comprise a first housing, a second housing, and a third housing,
   wherein the plurality of matching networks comprise a first matching network mounted in the first housing, a second matching network mounted in the second housing, and a third matching network mounted in the third housing, and
   wherein two adjacent ones of the first, second, and third housings are coupled into one by using the alignment plates.

* * * * *